United States Patent [19]

Tanaka

[11] Patent Number: 5,159,302
[45] Date of Patent: Oct. 27, 1992

[54] LADDER TYPE BAND-PASS FILTER COMPRISING OF ASSEMBLED PLURAL VIBRATOR BLOCKS

[75] Inventor: Yasuhiro Tanaka, Kyoto, Japan

[73] Assignee: Murata Manufacturing Co., Ltd., Japan

[21] Appl. No.: 554,786

[22] Filed: Jul. 18, 1990

[30] Foreign Application Priority Data

Jul. 19, 1989 [JP] Japan .................. 1-186834

[51] Int. Cl.⁵ .............................. H03H 9/10
[52] U.S. Cl. .................... 333/189; 310/348; 310/355
[58] Field of Search ............ 333/187, 189-192; 310/348, 352-355

[56] References Cited

U.S. PATENT DOCUMENTS

| 2,639,393 | 5/1953 | Birt et al. | 310/348 |
| 4,323,865 | 4/1982 | Tanaka et al. | 333/187 |
| 4,656,385 | 4/1987 | Tanaka | 333/189 X |
| 4,684,843 | 8/1987 | Ohya et al. | 310/348 X |

FOREIGN PATENT DOCUMENTS

| 210713 | 11/1984 | Japan | 333/190 |
| 60-124131 | 8/1985 | Japan | |
| 10909 | 1/1990 | Japan | 333/190 |

Primary Examiner—Eugene R. LaRoche
Assistant Examiner—Benny Lee
Attorney, Agent, or Firm—Ostrolenk, Faber, Gerb & Soffen

[57] ABSTRACT

There is disclosed a ladder type band-pass filter comprising plural vibrator blocks. Each vibrator block comprises a plate-shaped vibrator arranged in an electrically insulating frame. First and second metallic plates are fixed in the frame, and then, support the vibrator for vibration in the frame by arranging the vibrator between the first and second metallic plates. A pair of leading electrodes are formed on the frame so that a pair of leading electrodes are electrically connected to the first and second metallic plates, respectively, when the first and second metallic plates are fixed in the frame. Plural vibrator blocks are bonded in the axis direction of the frames, and the first and second leading electrodes of plural vibrator blocks are electrically connected so as to produce a ladder type band-pass filter.

19 Claims, 6 Drawing Sheets

LADDER TYPE BAND-PASS FILTER COMPRISING OF ASSEMBLED PLURAL VIBRATOR BLOCKS

BACKGROUND OF THE INVENTION

1. Field of the Invention

The present invention relates to a ladder type band-pass filter, more particularly, to a ladder type band-pass filter comprising plural vibrator blocks, each vibrator block being produced as a chip.

2. Description of Related Art

Conventionally, there has been put into practical use, a ladder type band-pass filter comprising ceramic piezoelectric vibrators 15 shown in the equivalent circuit diagram of FIG. 1, which has a steep cut-off frequency characteristic.

FIG. 2 shows the appearance of a ladder type band-pass filter comprising piezoelectric vibrators, and FIG. 3 shows a cross section thereof.

Referring to FIG. 3, the piezoelectric vibrators 15a, 15b, 15c, 15d, 15e, 15f and 15g are supported for vibration by spring terminal plates 14 and insulating plates 13 between opposing side plates 11a and 11b which are formed on a base 11 of an electrically insulating resin, and the piezoelectric vibrators 15a, 15b, 15c, 15d, 15e, 15f and 15g are electrically connected through lead wires so as to form a ladder type band-pass filter between an input terminal 16 and an output terminal 17 which are formed integrally in the base 11. Thereafter, the base 11 comprising the piezoelectric vibrators 15a, 15b, 15c, 15d, 15e, 15f and 15g is inserted and fixed in a metallic case 18, and then, a bottom portion of the metallic case 18 is sealed by a sealing member 19. In FIGS. 2 and 3, 20a and 20b denote ground terminals. It is to be noted that a resin case may be used instead of the metallic case 18.

In the conventional ladder type band-pass filter, the dimensions of the base 11 and the metallic case 18 are changed depending on the frequency of the pass band thereof and the number of the piezoelectric vibrators 15a, 15b, 15c, 15d, 15e, 15f and 15g. Therefore, it is necessary to prepare the other metal molds for forming the base 11 and the metallic case 18, and further, it becomes difficult to assemble the ladder type band-pass filter, automatically, resulting in a higher production cost.

Today, almost all the electric devices and components such as capacitors and resistor are produced as chips in order to improve the productivity and to decrease the production cost thereof. However, vibrators of conventional ladder type band-pass filters have not yet been produced as a chip.

SUMMARY OF THE INVENTION

An essential object of the present invention is to provide a ladder type band-pass filter comprising plural vibrator blocks, each vibrator block being produced as a chip.

Another object of the present invention is to provide a ladder type band-pass filter comprising plural vibrator blocks, which has a simple structure and the ability to be produced in mass.

A further object of the present invention is to provide a ladder type band-pass filter wherein it is not necessary to prepare many kinds of metal molds for forming the base and the metallic case thereof.

In order to accomplish the above objects, according to one aspect of the present invention, there is provided a ladder type band-pass filter comprising plural vibrator blocks produced as chips, each of said plural vibrator blocks comprising:

an electrically insulating frame;

a plate-shaped vibrator arranged in said frame;

first and second metallic plates for supporting said vibrator for vibration in said frame by arranging said vibrator between said first and second metallic plates, said first metallic plate being inserted from one end surface thereof and fixed in said frame, said second metallic plate being inserted from another end surface thereof and fixed in said frame;

a first leading electrode formed on said frame so that said first leading electrode is electrically connected to said first metallic plate when said first metallic plate is fixed in said frame; and a second leading electrode formed on said frame so that said second leading electrode is electrically connected to said second metallic plate when said second metallic plate is fixed in said frame, said plural vibrator blocks being bonded in the axis direction of said frames, and said filter further comprising connection electrodes for electrically connecting said first and second leading electrodes of said plural vibrator blocks so as to produce said ladder type band-pass filter.

According to another aspect of the present invention, the filter further comprises:

a first sealing an member for sealing end one of said plural vibrator blocks, said first sealing member being bonded on an end surface of said end vibrator block; and a second sealing member for sealing another end one of said plural vibrator blocks, said second sealing member being bonded on an end surface of said other end vibrator block.

According to a further aspect of the present invention, there is provided a filter, wherein each of said first and second metallic plates comprises a spherical projection portion in the center of one end surface opposing said vibrator, which is formed so as to have a spring.

According to a still further aspect of the present invention, there is provided a filter, wherein said frame comprises plural projection portions for supporting said first and second metallic plates on the inner surfaces thereof.

BRIEF DESCRIPTION OF THE DRAWINGS

These and other objects and features of the present invention will become clear from the following description taken in conjunction with the preferred embodiment thereof with reference to the accompanying drawings, in which:

FIG. 5b is a cross sectional view taken on line A—A' of FIG. 5a;

FIG. 6b is a side view showing the metallic plate shown in FIG. 6a;

DETAILED DESCRIPTION OF THE PREFERRED EMBODIMENT

A preferred embodiment according to the present invention will be described below with reference to the attached drawings.

Figure 1:
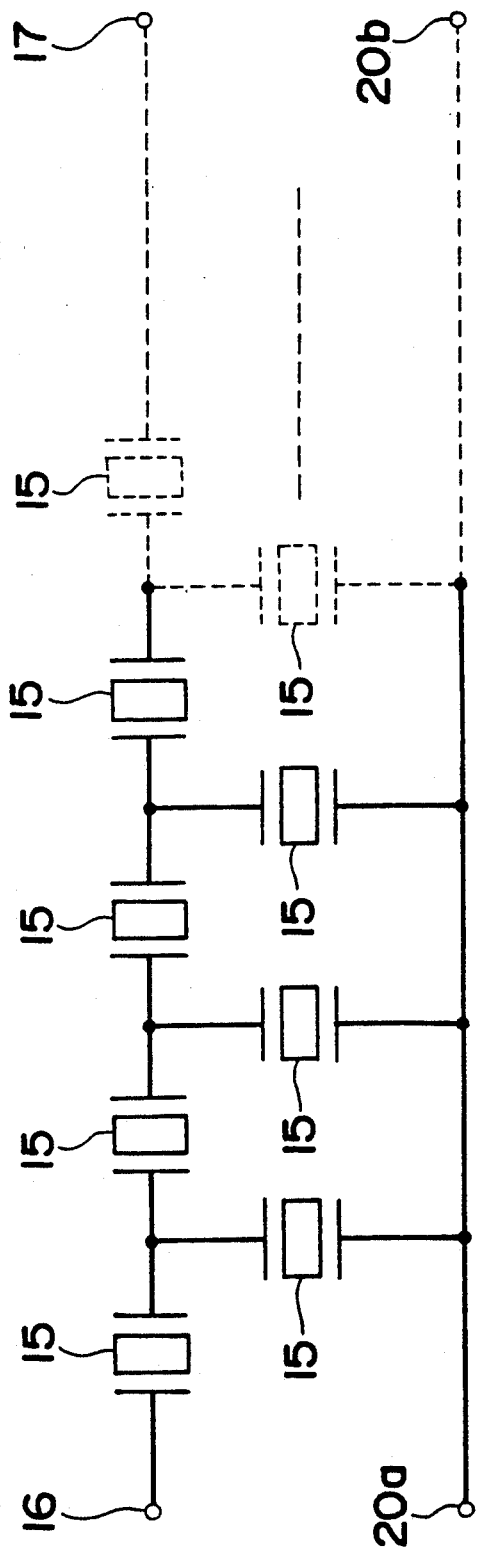
FIG. 1 is a circuit diagram showing an equivalent circuit of a conventional ladder type band-pass filter comprising plural piezoelectric vibrators.
Figure 2:
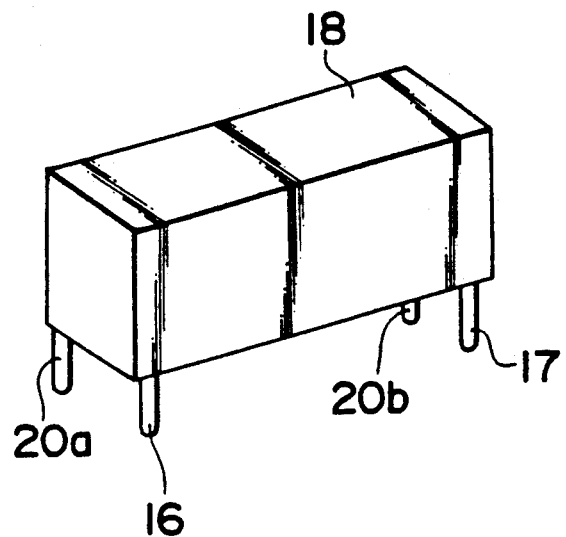
FIG. 2 is a perspective view showing the appearance of a conventional ladder type band-pass filter comprising plural piezoelectric vibrators.
Figure 3:
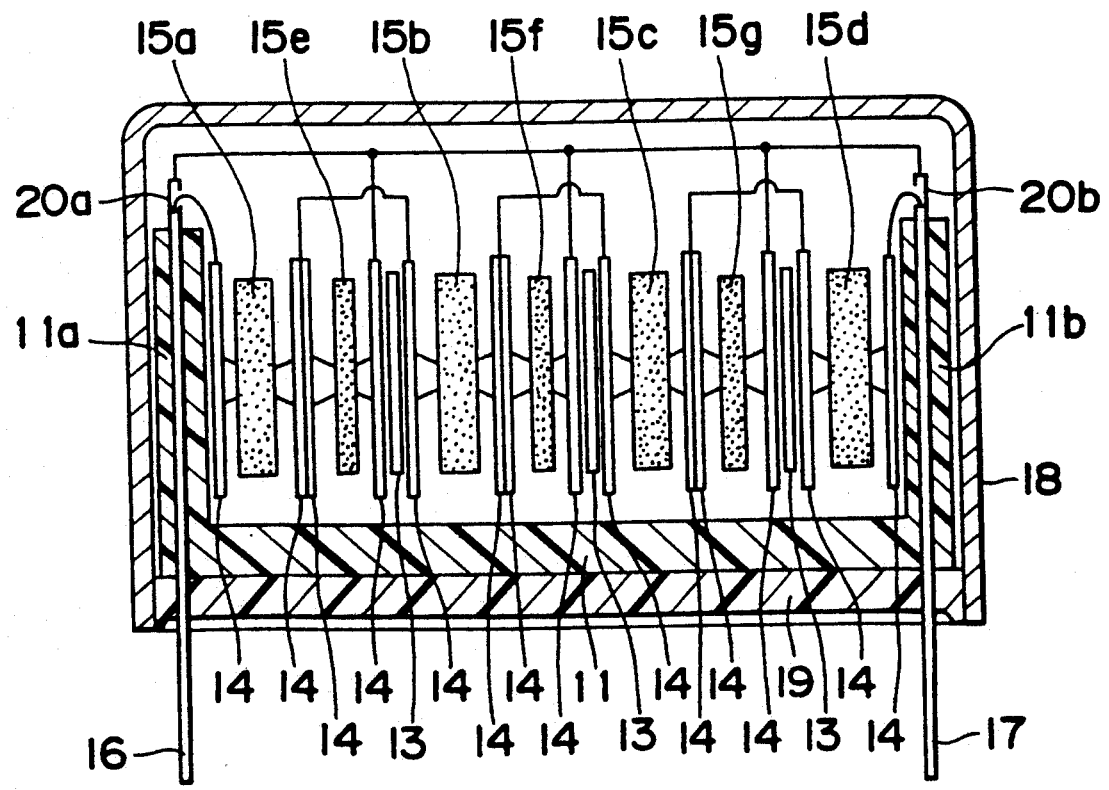
FIG. 3 is a cross sectional view showing the composition of the conventional ladder type band-pass filter shown in FIG. 2.
Figure 4:
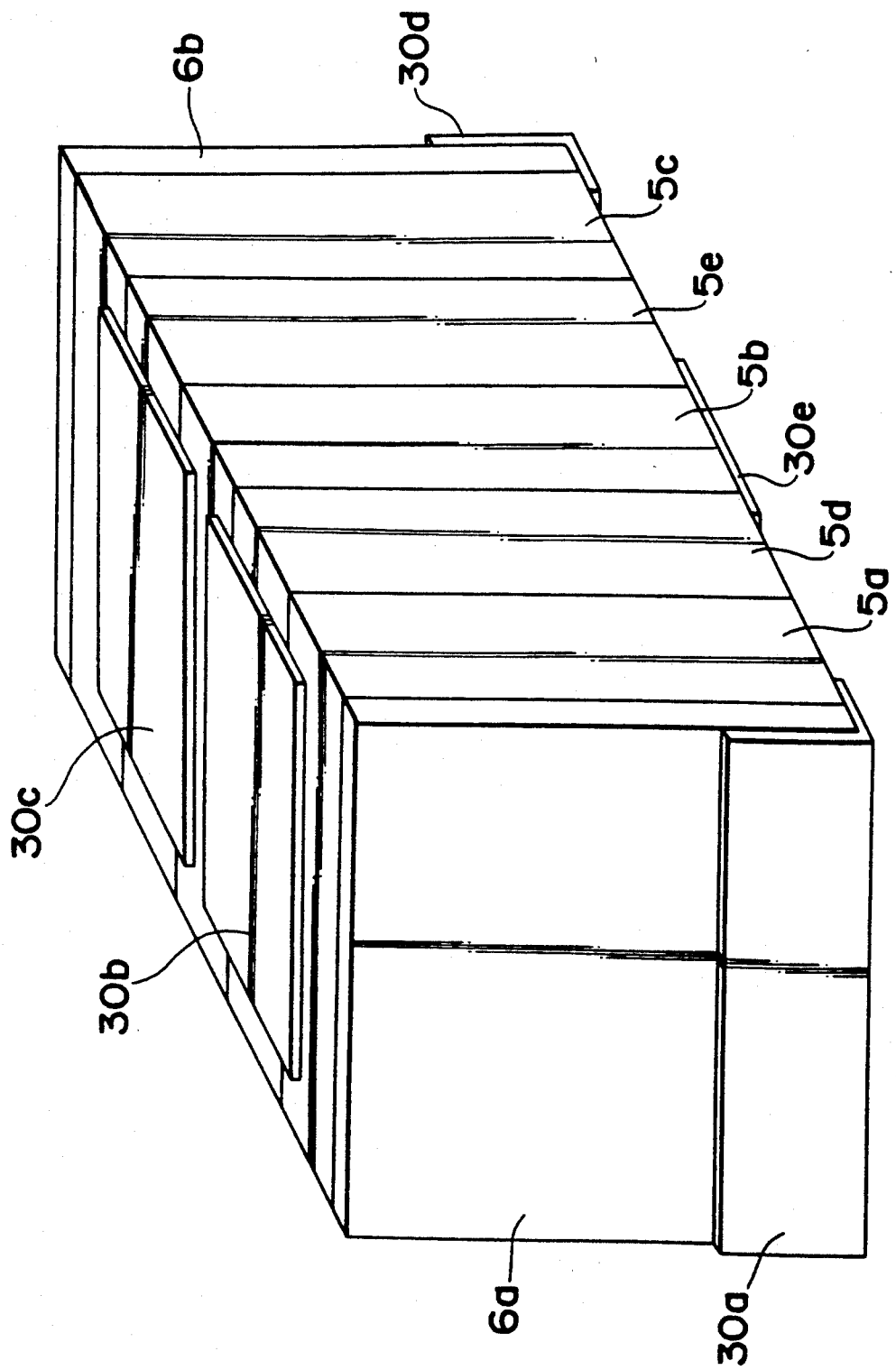
FIG. 4 is a perspective view showing the appearance of a ladder type band-pass filter of a preferred embodiment according to the present invention.

FIG. 4 shows the appearance of a ladder type band-pass filter of a preferred embodiment according to the present invention. The composition of the ladder type band-pass filter will be described below with reference to the attached drawings.

Referring to FIG. 4, the ladder type band-pass filter of the preferred embodiment comprises five vibrator blocks 5a to 5e, side surface sealing plates 6a and 6b, and electrodes 30a to 30e. The vibrator blocks 5a, 5d, 5b, 5e and 5c are provided between the side surface sealing plates 6a and 6b.

Figure 5A:
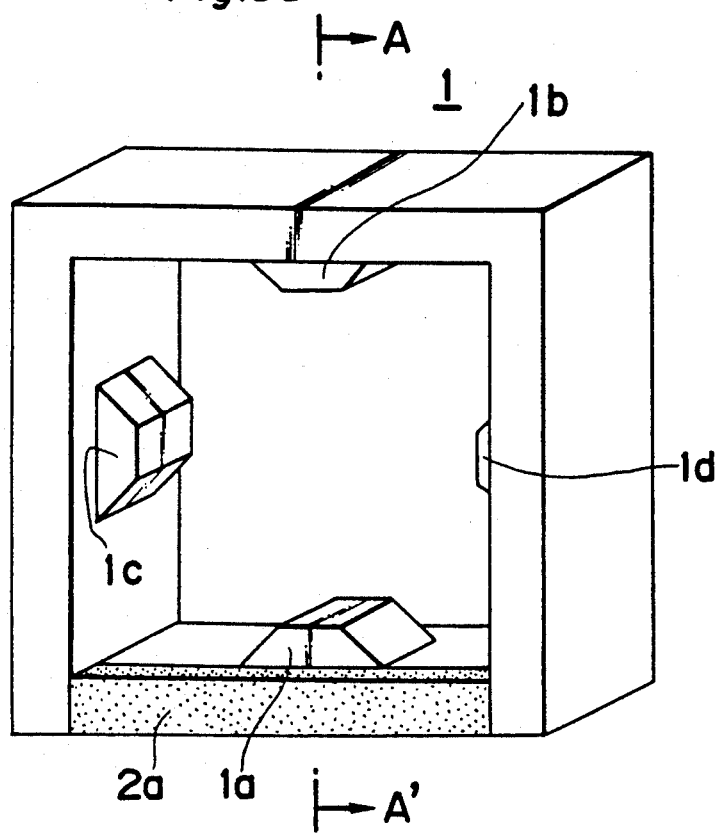
FIG. 5a is a perspective view showing a frame of a vibrator block of the ladder type band-pass filter shown in FIG. 4.
Figure 5B:
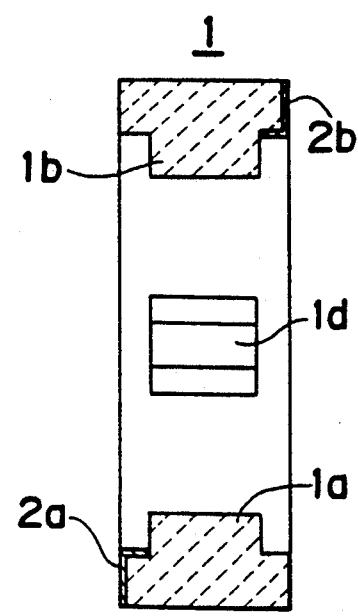
Figure 6A:
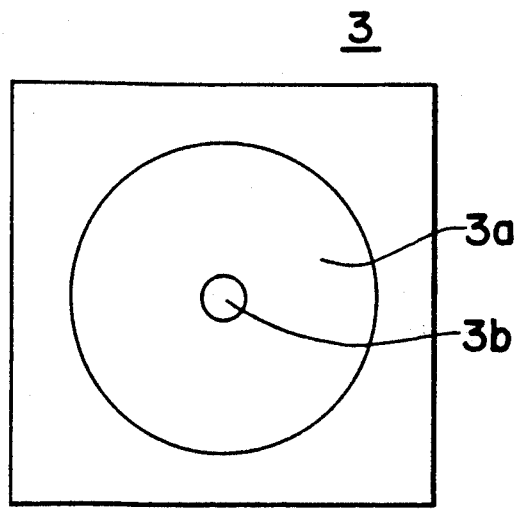
FIG. 6a is a front view showing a metallic plate of the ladder type band-pass filter shown in FIG. 4.
Figure 6B:
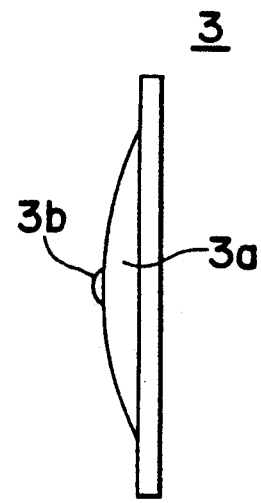
Figure 7:
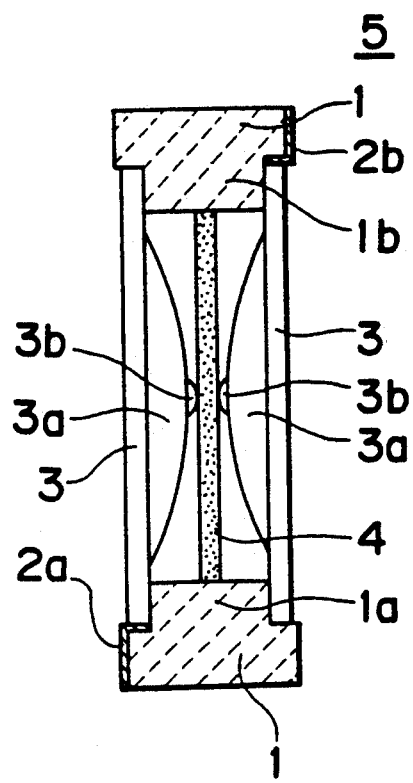
FIG. 7 is a cross sectional view showing an assembled vibrator block of the ladder type band-pass filter shown in FIG. 4.

Each of the vibrator blocks 5a to 5e comprises a frame 1 shown in FIGS. 5a and 5b, two metallic plates 3 shown in FIGS. 6a and 6b, and a plate-shaped ceramic piezoelectric or crystal vibrator 4 shown in FIG. 7.

FIG. 5a shows an appearance of the frame 1, and FIG. 5b shows a cross section thereof.

Figure 9:
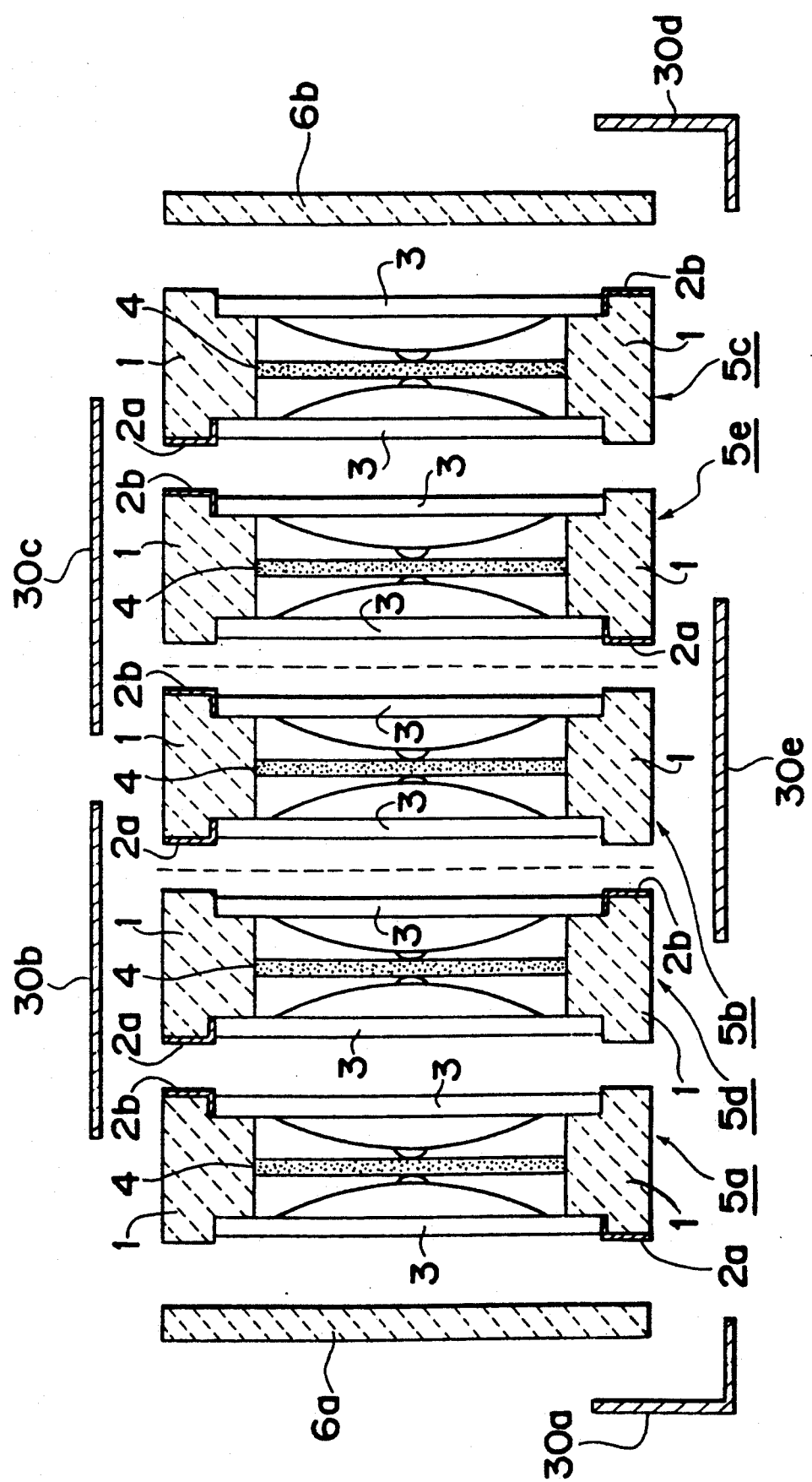
FIG. 9 is an exploded cross sectional view showing the ladder type band-pass filter shown in FIG. 4.

Referring to FIGS. 5a and 5b, an electrically insulating plate having heat resistance and solvent resistance which is made of ceramic such as alumina is formed into a square cylindrical shape having projection portions 1a to 1d having a cross section of a trapezoidal shape for supporting the metallic plates 3 in the center of each of four inner surfaces of the frame 1, resulting in the frame 1. A pair of leading electrodes 2a and 2b of Cu film are formed. One is formed on one end surface of the frame 1 and a partial portion of the inner surface thereof positioned between the one end surface thereof and the projection portion 1a. Another is formed on another end surface of the frame 1 and a partial portion of another inner surface thereof positioned between the end surface thereof and another projection portion 1b opposite the projection portion 1a. It is to be noted that the positions where a pair of leading electrodes 2a and 2b are formed are changed depending on the position of each of the vibrator blocks 5a to 5e produced as chips in the ladder type band-pass filter, as shown in FIG. 9.

FIG. 6a shows a front of the metallic plate 3, and FIG. 6b shows a side thereof.

Referring to FIGS. 6a and 6b, a thin metallic square plate is formed by the extrusion molding method in a press working process so as to form a spherical projection portion 3a in the center of one side surface thereof and a small spherical projection portion 3b in the center of the spherical projection portion 3a, resulting in the metallic plate 3 forming a spring in the direction of the thickness thereof.

As shown in FIG. 7, after arranging the vibrator 4 in the center of the frame 1, a pair of metallic plates 3 are inserted into the frame 1 from both end surfaces thereof so that the projection portions 3a thereof oppose in the inside of the frame 1, namely, fore each other, until a pair of the metallic plates 3 are in contact with the projection portions 1a to 1d of the frame 1, and then, the metallic plates 3 are fixed in the frame 1 so as to support the vibrator 4 therebetween. Then, one metallic plate 3 is in contact with the leading electrode 2a so as to be electrically connected thereto, and another metallic plate 3 is in contact with the leading electrode 2b so as to be electrically connected thereto, resulting in an electrical connection between one end surface of the vibrator 4 and the leading electrode 2a through one metallic plate 3, and an electrical connection between another end surface of the vibrator 4 and the leading electrode 2b through another metallic plate 3.

It is to be noted that, in the present preferred embodiment, the frames 1 of respective vibrator blocks 5a to 5e have the same shape, and the metallic plates 3 of respective vibrator blocks 5a, 5b, 5c, 5d and 5e have the same shape.

It is to be noted that the shape of the metallic plate 3 is limited to that shown in FIGS. 6a and 6b if the metallic plate 3 is inserted and fixed in the frame 1 so as to be electrically connected to the leading electrode 2a or 2b, and the metallic plate 3 may have a shape other than the square.

Figure 8:
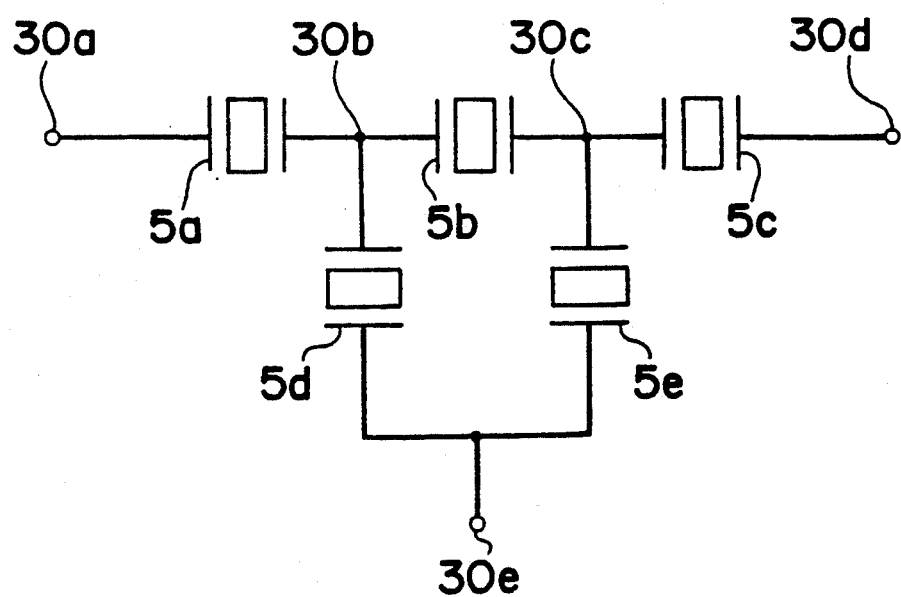
FIG. 8 is a circuit diagram showing an equivalent circuit of the ladder type band-pass filter shown in FIG. 4.

FIG. 8 shows an equivalent circuit of the ladder type band-pass filter of the present preferred embodiment shown in FIG. 4. Since the action of the ladder type band-pass filter is well known to those skilled in the art, it is omitted in the specification.

Referring to FIG. 8, the ladder type band-pass filter comprises five vibrators 5a, 5b, 5c, 5d and 5e. The input electrode 30a is electrically connected in series through the vibrator 5a, the electrode 30b, the vibrator 5b, the electrode 30c and the vibrator 5c to the output electrode 30d. The electrode 30b is electrically connected through the vibrator 5d to the ground electrode 30e, and the electrode 30c is electrically connected through the vibrator 5e to the ground electrode 30e.

FIG. 9 shows an exploded cross section of the ladder type band-pass filter of the present preferred embodiment shown in FIG. 4.

Referring to FIG. 9, respective vibrator blocks 5a to 5e are coupled in the order 5a, 5d, 5b, 5e and 5c with the opposing end surfaces thereof bonded by an adhesive agent. In each of the vibrator blocks 5a, 5b, 5c, 5d and 5e a pair of leading electrodes 2a and 2b are formed on the frame 1, as shown in FIG. 9. Namely, a pair of leading electrodes 2a and 2b of each of the vibrator blocks 5a and 5c to 5e are formed at positions of the frame 1 which are symmetrical with respective to the center point of the cross section of the frame 1. On the other hand, a pair of leading electrodes 2a and 2b of the vibrator block 5b are formed at positions of the frame 1 which are symmetrical with respect to the central lateral line of the cross section of the frame 1.

Thereafter, the L-shaped input electrode 30a is electrically connected to the leading electrode 2a of the vibrator block 5a, and the leading electrode 2b of the vibrator block 5a, the leading electrode 2a of the vibrator block 5d and the leading electrode 2a of the vibrator block 5b are electrically connected to each other through the electrode 30b. The leading electrode 2b of the vibrator block 5d and the leading electrode 2a of the vibrator block 5e are electrically connected to each other through the electrode 30e, and the leading electrode 2b of the vibrator block 5b, the leading electrode 2b of the vibrator block 5e and the leading electrode 2a of the vibrator block 5c are electrically connected to each other through the electrode 30c. Furthermore, the L-shaped output electrode 30d is electrically connected to the leading electrode 2b of the vibrator block 5c.

Prior to the connection of the electrodes 30a and 30d, the end surface sealing plate 6a is bonded on the outside end surface of the vibrator block 5a, and another end surface sealing plate 6b is bonded on the outside end surface of the vibrator block 5c. Prior to the bonding of respective vibrator blocks 5a, 5b, 5c, 5d, 5e electrically insulating plates may be arranged at positions as indicated by dotted lines of FIG. 9 between the vibrator blocks 5d and 5b and between the vibrator blocks 5b and 5e in order to obtain a high electrical insulation therebetween.

In the present preferred embodiment, there are provided a square cylinder-shaped frame 1 and a square-shaped metallic plate 3. However, the present invention is not limited to this. Each of the frame 1 and the metallic plate 3 may have a shape such as a circle, rectangle or polygon other than a square. In this case, the pattern and the shape of each of the leading electrodes 2a and 2b and the electrodes 30a to 30e may be changed depending on the shape of each of the frame 1 and metallic plate 3.

It is understood that various other modifications will be apparent to and can be readily made by those skilled in the art without departing from the score and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A ladder type band-pass filter comprising plural vibrator blocks, each of said plural vibrator blocks comprising:
    an electrically insulating frame having a hollow interior and having end surfaces opposing each other and having at least one inner surface in the hollow interior and at least one outer surface, said inner and outer surfaces being substantially perpendicular to said end surfaces, said frame having an axis aligned substantially perpendicular to said end surfaces;
    a plate-shaped vibrator arranged in said hollow interior of said frame;
    first and second metallic plates for supporting said vibrator for vibration in said frame arranged such that said vibrator is disposed between said first and second metallic plates, said first metallic plate disposed in said frame at one end surface of said frame, said second metallic plate disposed in said frame at the opposite end surface of said frame;
    a first leading electrode disposed on said frame extending from at least a portion of said at least one inner surface to at least a portion of the at least on outer surface of said frame so that said first leading electrode is electrically connected to said first metallic plate; and
    a second leading electrode disposed on said frame extending from at least a portion of said at least on inner surface to at least another portion of said at least one outer surface of said frame so that said second leading electrode is electrically connected to said second metallic plate;
    said plural vibrator blocks bonded together in a ladder shape filter configuration; and
    said filter comprising external connection electrodes for electrically interconnecting particular ones of said first and second leading electrodes of said plural vibrator blocks, said external connection electrodes disposed on said outer surfaces of said frames of said plural vibrator blocks, thereby realizing said ladder type band-pass filer.

2. The filter as claimed in claim 1, wherein said filter further includes two of said plural vibrator blocks as two opposed end vibrator blocks, and further comprising:
    a first sealing member for sealing one of said end vibrator blocks, said first sealing member bonded on an end surface of said one end vibrator block; and
    a second sealing member for sealing the other of said end vibrator blocks, said second sealing member bonded on an end surface of said other end vibrator block.

3. The filter as claimed in claim 1, wherein each of said first and second metallic plates has a surface having a center and further has a spherical projection portion in the center opposing said vibrator, said spherical projections giving said metallic plates a spring characteristic biasing against said vibrator.

4. The filter as claimed in claim 1, wherein said frame comprises plural projection portions for supporting said first and second metallic plates on said at least one inner surface.

5. The filter as claimed in claim 1, wherein said vibrator comprises a piezoelectric vibrator.

6. The filter as claimed in claim 1, wherein said vibrator comprises a crystal vibrator.

7. The filter as claimed in claim 1, wherein said of said frames is square in cross-section.

8. The filter as claimed in claim 1, wherein each of said frames is rectangular in cross-section.

9. The filter as claimed in claim 1, wherein each of said frames is polygonal in cross-section.

10. A ladder type band-pass filter comprising plural vibrator blocks, each of said plural vibrator blocks comprising:
    an electrically insulating frame having a hollow interior and having end surfaces opposing each other and having at least one inner surface in the hollow interior and at least one outer surface, said inner and outer surfaces being perpendicular to said end surfaces, said frame having an axis aligned perpendicular to said end surfaces;
    a plate-shaped vibrator arranged in said hollow interior of said frame;
    first and second metallic plates for supporting said vibrator for vibration in said frame arranged such that said vibrator is disposed between said first and second metallic plates, said first metallic plate disposed in said frame at one end surface of said frame, said second metallic plate disposed in said frame at the opposite end surface of said frame;

a first leading electrode disposed on said frame extending from at least a portion of said at least on inner surface to at least a portion of the at least one outer surface of said frame so that said first leading electrode is electrically connected to said first metallic plate; and a second leading electrode disposed on said frame extending from at least a portion of said at least on inner surface to at least another portion of said at least one outer surface of said frame so that said second leading electrode is electrically connected to said second metallic plate;

said plural vibrator blocks bonded together in a ladder shape filter configuration; and said filter comprising external connection electrodes for electrically interconnecting particular ones of said first and second leading electrodes of said plural vibrator blocks, said external connection electrodes disposed on said outer surfaces of said frames of said plural vibrator blocks, thereby realizing said ladder type band-pass filter, said ladder type band-pass filter having a configuration such that said plurality of vibrators are arranged in a ladder structure having side portions and rung portions, with said vibrators being connected by said external connection electrodes such that particular ones of said vibrators are connected in series in respective side portions along one side of the ladder structure and further other particular ones of said vibrators are connected in the rung portions from common points between said side portions to a common connection point forming an opposite side of said ladder structure.

11. A ladder type band-pass filter comprising plural vibrator blocks, each of said plural vibrator blocks comprising:

an electrically insulating frame having a hollow interior and having end surfaces opposing each other and having inner surfaces in the hollow interior and outer surfaces, said inner and outer surfaces being perpendicular to said end surfaces, said frame having an axis aligned perpendicular to said end surfaces;

a plate-shaped vibrator arranged in said hollow interior of said frame;

first and second metallic plates for supporting said vibrator for vibration in said frame arranged such that said vibrator is disposed between said first and second metallic plates, said first metallic plate disposed in said frame at one end surface of said frame, said second metallic plate disposed in said frame at the opposite end surface of said frame;

a first leading electrode disposed on said frame extending from at least a portion of an inner surface to at least a portion of an outer surface of said frame so that said first leading electrode is electrically connected to said first metallic plate; and a second leading electrode disposed on said frame extending from at least a portion of another inner surface to at least a portion of another outer surface of said frame so that said second leading electrode is electrically connected to said second metallic plate;

said plural vibrator blocks bonded together in a ladder shape filer configuration; and said filter comprising external connection electrodes for electrically interconnecting particular ones of said first and second leading electrodes of said plural vibrator blocks, said external connection electrodes disposed on said outer surfaces of said frames of said plural vibrator blocks, thereby realizing said ladder type band-pass filter.

12. The filter as claimed in claim 11, wherein said filter further includes two of said plural vibrator blocks as opposed end vibrator blocks, and further comprising:

a first sealing member for sealing one of said end vibrator blocks, said first sealing member bonded on an end surface of said one end vibrator block; and a second sealing member for sealing the other of said end vibrator blocks, said second sealing member bonded on an end surface of said other end vibrator block.

13. The filter as claimed in claim 11, wherein each of said first and second metallic plates has a surface having a center and further has a spherical projection portion in the center opposing said vibrator, said spherical projections giving said metallic plates a spring characteristic biasing against said vibrator.

14. The filter as claimed in claim 11, wherein said frame comprises plural projection portions for supporting said first and second metallic plates on said inner surfaces.

15. The filter as claimed in claim 11, wherein said vibrator comprises a piezoelectric vibrator.

16. The filter as claimed in claim 11, wherein said vibrator comprises a crystal vibrator.

17. The filter as claimed in claim 11, wherein each of said frames is square in cross-section.

18. The filter as claimed in claim 11, wherein each of said frames is rectangular in cross-section.

19. The filter as claimed in claim 11, wherein each of said frames is polygonal in cross-section.

* * * * *